United States Patent
Proctor, Jr.

(10) Patent No.: US 9,294,222 B2
(45) Date of Patent: Mar. 22, 2016

(54) VARIABLE RATE CODING FOR FORWARD AND REVERSE LINK

(71) Applicant: Intel Corporation, Santa Clara, CA (US)

(72) Inventor: James A. Proctor, Jr., Indiatlantic, FL (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/183,181

(22) Filed: Feb. 18, 2014

(65) Prior Publication Data

US 2014/0181622 A1 Jun. 26, 2014

Related U.S. Application Data

(63) Continuation of application No. 13/470,922, filed on May 14, 2012, now abandoned, which is a continuation of application No. 12/210,754, filed on Sep. 15, 2008, now Pat. No. 8,194,783, which is a (Continued)

(51) Int. Cl.
*H04L 1/00* (2006.01)
*H04W 72/08* (2009.01)
(Continued)

(52) U.S. Cl.
CPC .............. *H04L 1/0041* (2013.01); *H03M 13/03* (2013.01); *H04L 1/0009* (2013.01); *H04L 1/0025* (2013.01)

(58) Field of Classification Search
CPC ..... H03M 13/00; H03M 13/03; H03M 13/23; H04J 13/10; H04L 1/0059; H04L 1/0071; H04L 1/0009; H04L 1/0041
USPC .................. 370/310, 342; 375/146, 140, 130; 714/776, 752, 746, 699
See application file for complete search history.

(56) References Cited

U.S. PATENT DOCUMENTS 4,099,257 A 7/1978 Arnold et al.
4,460,992 A 7/1984 Gutleber
(Continued)

FOREIGN PATENT DOCUMENTS

EP 0 443 061 2/1990
EP 0 635 949 7/1994
(Continued)

OTHER PUBLICATIONS

TIA/EIA Standard, Mobile Station-Base Station Compatibility Standard for Wideband Spread Spectrum Cellular Systems, TIA/EIA-95-B (Upgrade and Revision of TINEIA-95-A) (Mar. 1999).*
(Continued)

*Primary Examiner* — Chieh M Fan
*Assistant Examiner* — Michelle M Koeth
(74) *Attorney, Agent, or Firm* — Blakely, Sokoloff, Taylor & Zafman LLP (57) ABSTRACT

A technique for encoding a signal used in a digital communication system in which individual traffic channel data rates may be adapted to specific channel conditions. In particular, a forward error correction coding rate is adapted for individual channels while at the same time maintaining a fixed block size independent of the FEC coding rate. This allows the system data rate to adapt to the channel conditions experienced by a specific user. Thus, users experiencing good communication conditions with low multipath distortion may be allocated higher capacity, whereas users with significant multipath distortion may make use of lower rate (higher levels of coding) error codes to maintain high quality. Messages are sent from a transmitter to a receiver to inform the receiver of the coding rate implemented at any given point in time. These parameters may be adjusted independent of transmitted power level through the expedient of ensuring that size of a transmitted frame remains constant, while permitting the ability to change FEC coding rates and FEC block sizes.

15 Claims, 4 Drawing Sheets

Related U.S. Application Data continuation of application No. 10/890,485, filed on Jul. 13, 2004, now Pat. No. 7,426,241, which is a continuation of application No. 09/447,022, filed on Nov. 22, 1999, now Pat. No. 6,785,323.

(51) Int. Cl.
*H03M 13/03* (2006.01)
*H03M 13/00* (2006.01)

(56) References Cited

U.S. PATENT DOCUMENTS

| | | | |
|---|---|---|---|
| 4,625,308 A | 11/1986 | Kim et al. | |
| 4,862,453 A | 8/1989 | West et al. | |
| 4,866,709 A | 9/1989 | West et al. | |
| 5,027,348 A | 6/1991 | Curry, Jr. | |
| 5,103,459 A | 4/1992 | Gilhousen et al. | |
| 5,115,309 A | 5/1992 | Hang | |
| 5,128,942 A | 7/1992 | Kojima | |
| 5,140,323 A | 8/1992 | Kadono et al. | |
| 5,161,194 A | 11/1992 | Ujiie | |
| 5,321,725 A | 6/1994 | Paik et al. | |
| 5,341,396 A | 8/1994 | Higgins et al. | |
| 5,394,473 A | 2/1995 | Davidson | |
| 5,440,545 A | 8/1995 | Buchholz et al. | |
| 5,455,629 A | 10/1995 | Sun et al. | |
| 5,463,403 A | 10/1995 | Walker et al. | |
| 5,487,072 A | 1/1996 | Kant | |
| 5,511,079 A * | 4/1996 | Dillon | 714/774 |
| 5,533,004 A | 7/1996 | Jasper et al. | |
| 5,559,788 A | 9/1996 | Zscheile, Jr. et al. | |
| 5,606,574 A | 2/1997 | Hasegawa et al. | |
| 5,608,738 A | 3/1997 | Matsushita | |
| 5,612,956 A | 3/1997 | Walker et al. | |
| 5,619,337 A | 4/1997 | Naimpally | |
| 5,638,384 A | 6/1997 | Hayashi et al. | |
| 5,663,958 A | 9/1997 | Ward | |
| 5,699,364 A | 12/1997 | Sato et al. | |
| 5,699,369 A | 12/1997 | Guha | |
| 5,729,557 A * | 3/1998 | Gardner et al. | 714/774 |
| 5,745,251 A | 4/1998 | Yamagami | |
| 5,751,761 A | 5/1998 | Gilhousen | |
| 5,768,291 A | 6/1998 | Kelton et al. | |
| 5,777,990 A | 7/1998 | Zehavi et al. | |
| 5,781,542 A | 7/1998 | Tanaka et al. | |
| 5,805,567 A | 9/1998 | Ramesh | |
| 5,815,508 A | 9/1998 | Wadzinske et al. | |
| 5,825,807 A | 10/1998 | Kumar | |
| 5,844,918 A | 12/1998 | Kato | |
| 5,889,791 A | 3/1999 | Yang | |
| 6,141,353 A | 10/2000 | Li | |
| 6,151,332 A | 11/2000 | Gorsuch et al. | |
| 6,154,499 A | 11/2000 | Bhaskar et al. | |
| 6,157,612 A | 12/2000 | Weerackody et al. | |
| 6,175,871 B1 | 1/2001 | Schuster et al. | |
| 6,216,244 B1 | 4/2001 | Myers et al. | |
| 6,236,647 B1 | 5/2001 | Amalfitano | |
| 6,269,129 B1 | 7/2001 | Rhee et al. | |
| 6,272,148 B1 | 8/2001 | Takagi et al. | |
| 6,285,681 B1 | 9/2001 | Kolze et al. | |
| 6,310,856 B1 | 10/2001 | Taipale | |
| 6,345,123 B1 | 2/2002 | Boon | |
| 6,460,154 B1 | 10/2002 | Duxbury | |
| 6,466,586 B1 | 10/2002 | Darveau et al. | |
| 6,477,669 B1 | 11/2002 | Agarwal et al. | |
| 6,496,543 B1 * | 12/2002 | Zehavi | 375/295 |
| 6,628,667 B1 | 9/2003 | Murai et al. | |
| 6,700,881 B1 * | 3/2004 | Kong et al. | 370/335 |
| 6,728,296 B1 * | 4/2004 | Yung | 375/141 |
| 6,785,323 B1 * | 8/2004 | Proctor, Jr. | 375/146 |
| 6,819,658 B1 | 11/2004 | Agarwal et al. | |
| 6,876,671 B1 | 4/2005 | Rambaud et al. | |
| 6,917,629 B1 | 7/2005 | Ramesh et al. | |
| 6,967,943 B1 * | 11/2005 | Hamalainen et al. | 370/347 |
| 7,046,631 B1 | 5/2006 | Giroux et al. | |
| 7,046,653 B2 | 5/2006 | Nigrin et al. | |
| 7,058,077 B1 | 6/2006 | Guo et al. | |
| 7,145,964 B2 | 12/2006 | Hoffmann et al. | |
| 7,426,241 B2 * | 9/2008 | Proctor, Jr. | 375/265 |
| 7,593,380 B1 | 9/2009 | Ferguson et al. | |
| 7,785,323 B2 | 8/2010 | Jenkins et al. | |
| 7,826,437 B2 | 11/2010 | Ferguson et al. | |
| 8,194,783 B2 * | 6/2012 | Proctor, Jr. | 375/295 |
| 2004/0128696 A1 | 7/2004 | Bhaskaran et al. | |
| 2009/0010368 A1 | 1/2009 | Proctor, Jr. | |
| 2014/0181622 A1 | 6/2014 | Proctor, Jr. | |

FOREIGN PATENT DOCUMENTS

| | | |
|---|---|---|
| EP | 0827312 | 3/1998 |
| EP | 0 827 312 | 4/1998 |
| EP | 0903883 | 3/1999 |
| EP | 0 998 069 | 10/1999 |
| FR | 2 266 389 | 10/1975 |
| FR | 2 761 557 | 3/1997 |
| JP | 63-28145 | 2/1988 |
| JP | 01-212148 | 8/1989 |
| JP | 04-111554 | 4/1992 |
| JP | 05-327772 | 12/1993 |
| JP | 08-163102 | 6/1996 |
| JP | 08-214043 | 8/1996 |
| JP | 08-265304 | 10/1996 |
| JP | 8-265304 | 10/1996 |
| JP | 9-23212 | 1/1997 |
| JP | 09-083603 | 3/1997 |
| JP | 09-139727 | 5/1997 |
| JP | 10-022937 | 1/1998 |
| JP | 10-107993 | 4/1998 |
| JP | 10-145341 | 5/1998 |
| WO | WO-96/04718 | 2/1996 |
| WO | 96/13914 | 5/1996 |
| WO | WO-96/26582 | 8/1996 |
| WO | WO-97/11535 | 3/1997 |
| WO | WO-9709810 | 3/1997 |
| WO | 98/19481 | 5/1998 |
| WO | 98/43373 | 10/1998 |
| WO | 98/59447 | 12/1998 |
| WO | 99/14878 | 3/1999 |
| WO | 99/39472 | 8/1999 |
| WO | 99/41872 | 8/1999 |
| WO | WO-9939472 | 8/1999 |
| WO | 99/44341 | 9/1999 |
| WO | 99/45660 | 9/1999 |
| WO | 00/52831 | 9/2000 |
| WO | 00/65764 | 11/2000 |
| WO | 00/72496 | 11/2000 |

OTHER PUBLICATIONS

Office Action from European Application No. 09173620.7 mailed Oct. 22. 2012, 2 pages.
Office Action from Chinese Application No. 200910128510.6 issued Oct. 10, 2012, 2 pages.
Office Action from U.S. Appl. No. 13/493,575 mailed Jan. 17, 2013, 13 pages.
Search Report for European Application No. 09173620.7 mailed Jan. 25, 2013, 5 pages.
Search Report for European Application No. 10183999.1 mailed Feb. 13, 2013, 5 pages.
Office Action from Japanese Application No. 2001-540967 mailed Jan. 22, 2013, 5 pages.
Office Action from Japanese Application No. 2011-177739 mailed Dec. 25, 2012, 4 pages.
Office Action from U.S. Appl. No. 13/470,922 mailed May 21, 2013, 38 pages.
TIA/EIA Standard, Mobile Station-Base Station Compatibility Standard for Wideband Spread Spectrum Cellular Systems. TIA/EIA-95-B (Upgrade and Revision of TINEIA-95-A) (Mar. 1999).
Office Action from U.S. Appl. No. 13/493,575 mailed Jun. 18, 2013, 11 pages.
Decision on Appeal from Japanese Application No. 2001-540967 mailed Jul. 23, 2013, 6 pages.

(56) References Cited

OTHER PUBLICATIONS

Final Office Action from U.S. Appl. No. 13/470,922 mailed Oct. 21, 2013, 22 pages.
Office Action from U.S. Appl. No. 13/493,575 mailed Nov. 19, 2013, 12 pages.
Advisory Action from U.S. Appl. No. 13/470,922 mailed Feb. 6, 2014, 6 pages.
Ericsson, "EDGE: Concept Proposal for Enhanced GPRS," ETSI SMG2 Working Session on EDGE, TDoc SMG2 EDGE 006/99 (Mar. 2-4, 1999).
Hagenauer, J., "Rate-Compatible Punched Convolution Codes (RCPC Codes) and their Applications," IEEE Transactions on Communications, 36(4): 389-400 (Apr. 1988).
Hanzo et al., Burst-By-Burst Adaptive Wideband Wireless Video Telephony,: Communications and Vehicular: 215-232 (2000).
Lin et al., "Automatic-Repeat-Request-Error-Control Schemes," IEEE Communications Magazine, 22(12): 5-17 (Dec. 1984).
Rupar et al., "Satelite VSAT Networking Using CDMA," AIAA-98-5128, pp. 1-6 (Oct. 1998).
Shacham, N., "A Selective-Repeat-ARQ Protocol for Parallel Channels and Its Resequencing Analysis," IEEE Transactions on Communications: 40(4): 773-782 (Apr. 1992).
TIA/EIA Interim Standard, Mobile Station-Base Station Compatibility Standard for Dual-Mode Wideband Spread Spectrum Cellular System, TIA/EIA/IS-95-A (Revision of TIA/EIA/IS-95) (May 1995).
TIA/EIA Interim Standard, Mobile Station-Base Station Compatibility Standard for Wideband Spread Spectrum Cellular Systems, TIA/EIA-95-B (Upgrade and Revision of TIA/EIA-95-A) (Mar. 1999).
Wang et al., "Spread Spectrum Multiple-Access with DPSK Modulation and Diversity for Image Transmission over Indoor Radio Multiath Fading Channels," IEEE, pp. 200-214 (1996).
Final Office Action from U.S. Appl. No. 13/493,575 mailed Jun. 6, 2014, 15 pages.
Notice of Reexamination dated Jul. 23, 2014 (+ English translation), in Chinese Patent Application No. 200910128510.6, 10 pages.
Advisory Action mailed Sep. 22, 2014, in U.S. Appl. No. 13/493,575, 6 pages.
Non-Final Office Action for U.S. Appl. No. 14/593,539 mailed Jul. 1, 2015, 10 pages.
Office Action for Chinese Patent Application No. 200910128510.6 mailed Jun. 3, 2015, 7 pages.

\* cited by examiner

VARIABLE RATE CODING FOR FORWARD AND REVERSE LINK

CROSS REFERENCE TO RELATED APPLICATIONS

This application is a Continuation of, and claims the benefit of priority of U.S. patent application Ser. No. 13/470,922, filed May 14, 2012, which is a continuation of U.S. patent application Ser. No. 12/210,754, filed Sep. 15, 2008, which issued on Jun. 5, 2012 as U.S. Pat. No. 8,194,783, which is a continuation of U.S. patent application Ser. No. 10/890,485, filed Jul. 13, 2004, which issued on Sep. 16, 2008 as U.S. Pat. No. 7,426,241, which is a continuation of U.S. patent application Ser. No. 09/447,022, filed Nov. 22, 1999, which issued on Aug. 31, 2004 as U.S. Pat. No. 6,785,323.

FIELD OF INVENTION

This invention relates generally to wireless communication systems, and more particularly to a technique for providing variable data rate connections over digitally encoded radio channels.

BACKGROUND

The first generation of personal wireless communication devices, such as cellular radio telephones, operated by allocating distinct individual radio carrier frequencies to each user. For example, in an Advanced Mobile Phone Service (AMPS) type cellular mobile telephone, two 30 kiloHertz (kHz) bandwidth channels are allocated to support full duplex audio communication between each subscriber unit and a base station. The signals within each such channel are modulated using analog techniques such as frequency modulation (FM).

Later generation systems make use of digital modulation techniques in order to allow multiple users to access the same frequency spectrum at the same time. These techniques ostensibly increase system capacity for a given available radio bandwidth. The technique which has emerged as the most popular within the United States is a type of Code Division Multiple Access (CDMA). With CDMA, each traffic signal is first encoded with the pseudorandom (PN) code sequence at the transmitter. The receivers include equipment to perform a PN decoding function in such a way that signals encoded with different PN code sequences or with different code phases can be separated from one another. Because PN codes in and of themselves do not provide perfect separation of the channels, certain systems have an additional layer of coding referred to as "orthogonal codes" in order to reduce interference between channels.

In order for the PN and orthogonal code properties to operate properly at a receiver, certain other design considerations must be taken into account. For signals traveling in a reverse link direction, that is, from a mobile unit back to a central base station, power levels must be carefully controlled. In particular, the orthogonal properties of the codes are optimized for the situation where individual signals arrive at the receiver with approximately the same power level. If they do not, channel interference increases.

The forward link direction presents a different problem. In particular, a signal traveling from the base station to a subscriber unit may interfere with another signal in an unpredictable way as a result of the so-called near far problem. For example, faraway mobile units require relatively high power in order to be detected properly whereas close-in mobile units require lower power. The stronger signals may interfere with proper operation of mobile units located closer to the base station which typically operate with lower power levels. Unfortunately, this behavior depends upon the specific operating environment of the mobile communications system, including the topology of the surrounding geography, the juxtaposition of the subscriber units with respect to one another, and other factors.

In the past, it has been possible to set power levels individually to optimize each forward link channel so that interference is minimized. In particular, it has been suggested that each power level can be adjusted to affect an optimum received power level at the subscriber unit which tends to minimize interference.

In addition, coding algorithms such as forward error correction (FEC) type algorithms using convolutional, Reed-Solomon, and other types of codes, may be used to increase effective signal-to-noise ratio at the receiver. While such codes do provide increased performance in terms of lower bit error rates in noisy environments, by themselves they do not improve the difficulties associated with co-channel interference.

SUMMARY

The present invention provides an additional degree of freedom by permitting individual traffic channel data rates to adapt to specific channel conditions. In particular, a forward error correction (FEC) coding rate may be adapted for individual channels. At the same time, a fixed number of FEC symbols is maintained per transmitted frame, independent of the FEC coding rates and power levels. This allows a different FEC rate or even a different FEC code to be assigned to each user channel, depending upon channel conditions, without changing the effective transmitted power levels.

For example, if the channel is experiencing relatively good propagation conditions, the FEC coding rate may be reduced and the number of input bits per FEC frame may be increased without changing transmit power levels. Because the overall information rate then depends upon the ratio of the raw data rate divided by the code rate, a higher information rate is obtained without producing greater interference to other user channels.

On the other hand, if a particular channel is in a relatively bad or marginal transmission environment, other steps can be taken to reduce the overall information rate. Specifically, rather than increasing the power level of the transmission, the effective FEC coding rate can be increased, and the number of input bits per FEC frame reduced. This then permits the channel to be more robust without increasing the transmit power level.

In a preferred embodiment, the FEC coding rate is changed by periodically sending a message to the intended receiver which indicates the coding rate to be used in future transmissions on each given channel. For example, in a typical implementation, a rate message may be sent on the forward link paging channel or sync channel directed to a particular receiver.

There are several advantages to the present invention. In a Code Division Multiple Access (CDMA) system, especially in environments where multipath fading or other poor channel conditions exist, power levels need not be adjusted in order to optimize the overall system information rate.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
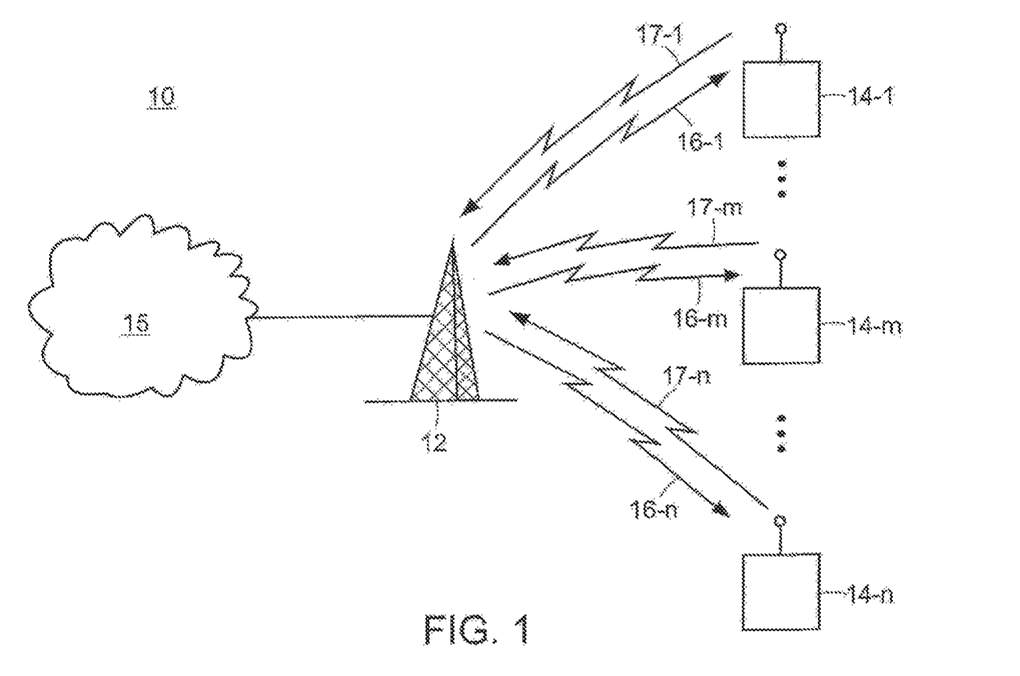
FIG. 1 is a high-level diagram of a wireless communication system in which the invention may be used.

Turning attention bow to the drawings more particularly, FIG. 1 is a block diagram of a system 10 for providing high speed data service over a wireless connection such as, for example, a digitally modulated wireless service known as Code Division Multiple Access (CDMA). The system 10 consists of one or more base station processors 12 and multiple subscriber access units 14-1, . . . , 14-$n$, . . . , 14-$m$ (collecting access units 14). FIG. 1 illustrates one base station 12 and three access units 14 by way of example only and for ease of description of the invention. The invention is applicable to systems in which there are typically many more subscriber units communicating with one or more base stations.

The access units 14 provide wireless data services and can connect devices such as, for example, laptop computers, portable computers, personal digital assistants (PDAs) or the like, through base station 12 to a network 15 which can be a Public Switched Telephone Network (PSTN), a packet switched computer network, or other data network such as the Internet or a private intranet. The base station 12 may communicate with the network 15 over any number of different efficient communication protocols such as primary rate ISDN, or other LAPD based protocols such as IS-634 or V5.2, or even TCP/IP if network 15 is an Ethernet network such as the Internet. The access units 14 may be mobile in nature and may travel from one location to another while communicating with base station 12.

It is also to be understood by those skilled in the art that FIG. 1 may be similar to a standard cellular type communication system in which radio channels are assigned to carry signals between the base stations 12 and access units 14. This invention, however, applies more particularly to non-voice, digital data transmissions of varying bandwidths. In a preferred embodiment, the system 10 uses code division multiple access (CDMA) principles for modulating the transmitted signals. However, it is also to be understood that the invention is not limited to using standardized CDMA protocols such as IS-95, or even newer emerging CDMA protocols such as CDMA-One or WCDMA. The invention is applicable to other multiple access modulation techniques.

In order to provide data and voice communication between the access units 14 and the base station 12, a limited number of radio channel resources are provided via forward communication channels 16-1, . . . , 16-$n$, and reverse communication channels 17-1, . . . , 17-$n$. The invention provides for precise management of a way in which these channel signals are encoded on an as-needed basis for each access unit 12. It should be understood that data signals travel bi-directionally across the radio channels 16 and 17, i.e., data signals originating at the access unit 14 are coupled to the network 15, and data signals received from the networks are coupled to the access units 14.

Figure 2:
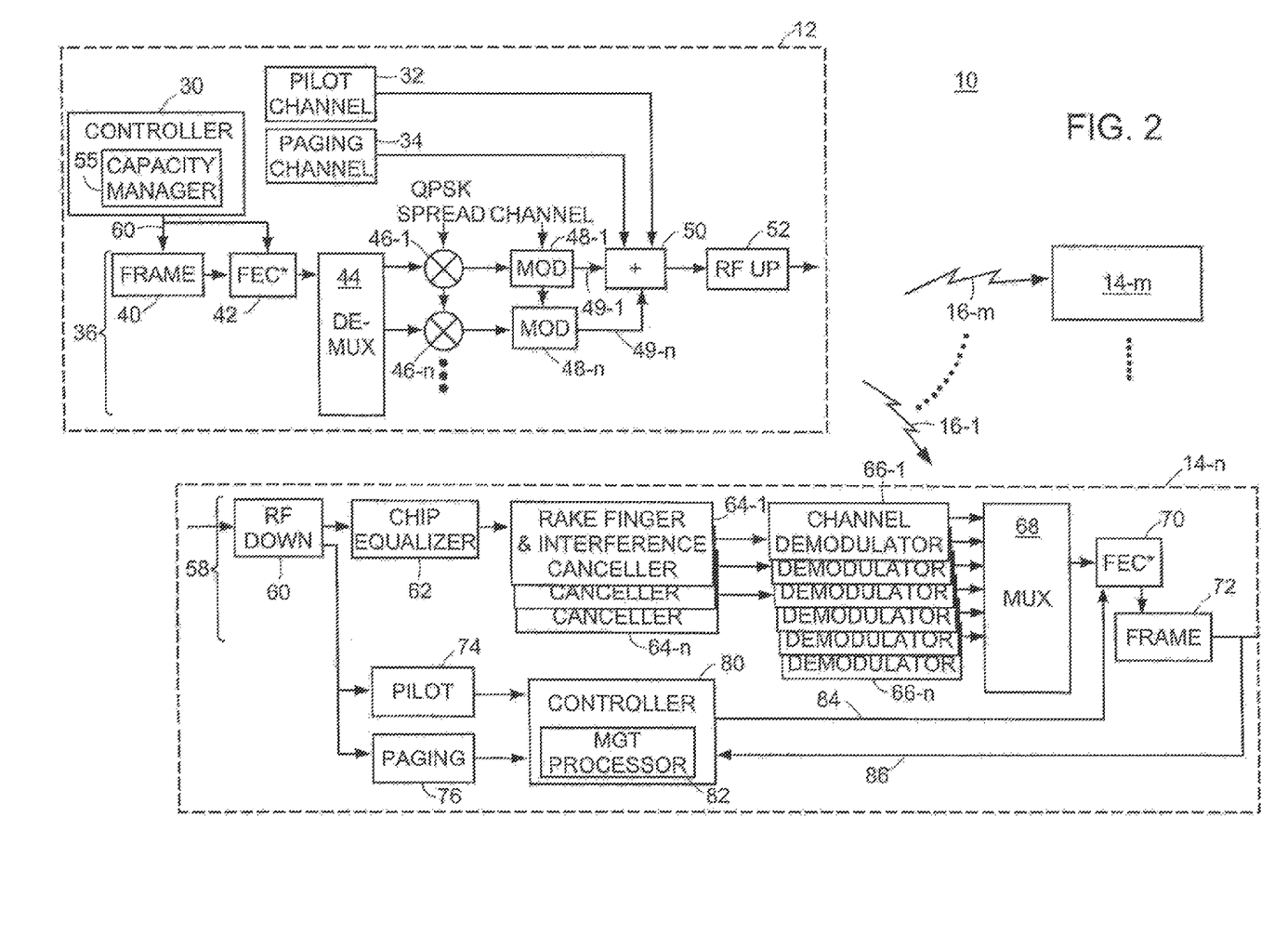
FIG. 2 is a more detailed diagram of the forward link portions of the system 15 which implements variable rate coding according to the invention.

FIG. 2 shows certain elements of the base station processor 12 and remote access unit 14 in more detail. The base station processor 12 and access unit 14 communicate at least in a forward direction over one or more of the forward link channels 16-1, . . . , 16-$n$. It should be understood that the base station 12 and access unit 14 may also communicate with one another in a reverse link direction, although the details of such are not shown in FIG. 2. The principles discussed herein for the forward link 16 implementation could also be used in implementing reverse link direction communications.

In a CDMA system, the signaling on a given forward link 16-$n$ shares a common radio carrier frequency and time slot with signaling intended for other forward links 16-$m$. Therefore, it is entirely possible that the signaling sent over a given forward link 16-$n$ intended only for a specific access unit 14-$n$ may in some way interfere with the signaling transmitted over another forward link 16-$m$ and intended for another access unit 14-$m$.

The base station processor 12 more particularly includes a controller 30 and signal processing circuits which generate the various signals making up the forward link 16 transmitted signals. These include circuits for implementing functions such as a pilot channel 32, paging channel 34, and one or more traffic channels 36. As it is known in the art, the pilot channel 32 is responsible for generating known continuous pilot signals that permit receiver circuits in the access unit 14 to properly synchronize to signals transmitted by the base station processor 12. The paging channel 34 sends control signals to the access unit 14 to, for example, allocate traffic channel capacity over the forward link 16. For example, the paging channel 34 is used to send messages to the access unit 14-$n$ when it is necessary to allocate a traffic channel on the forward link 16-$n$ when messages need to be sent to the access unit 14-$n$.

The traffic channel 36 provides a physical layer structure for sending pay load data over the forward links 16. In a preferred embodiment, CDMA encoding is used to define the pilot channels 32, paging channels 34, as well as the traffic channels 36.

More specifically, the traffic channel circuitry 36 includes symbol framing function 40, forward error correction logic 42, a demultiplexer 44, a summer 50, and radio frequency (RF) up converters 32.

Data which is to be sent over the forward link 16 is first fed to the framing function 40. The framing function 40 packages input sized groups referred to as frames. The size of these pre-encoded frames will vary depending upon the particular forward error correction (FEC) coding scheme selected at any given time by the FEC encoder 42. What is important is that the combination of the framers 40 and FEC encoder 42 produce a feed number of output FEC symbols in each given transmitted frame.

Figure 3:
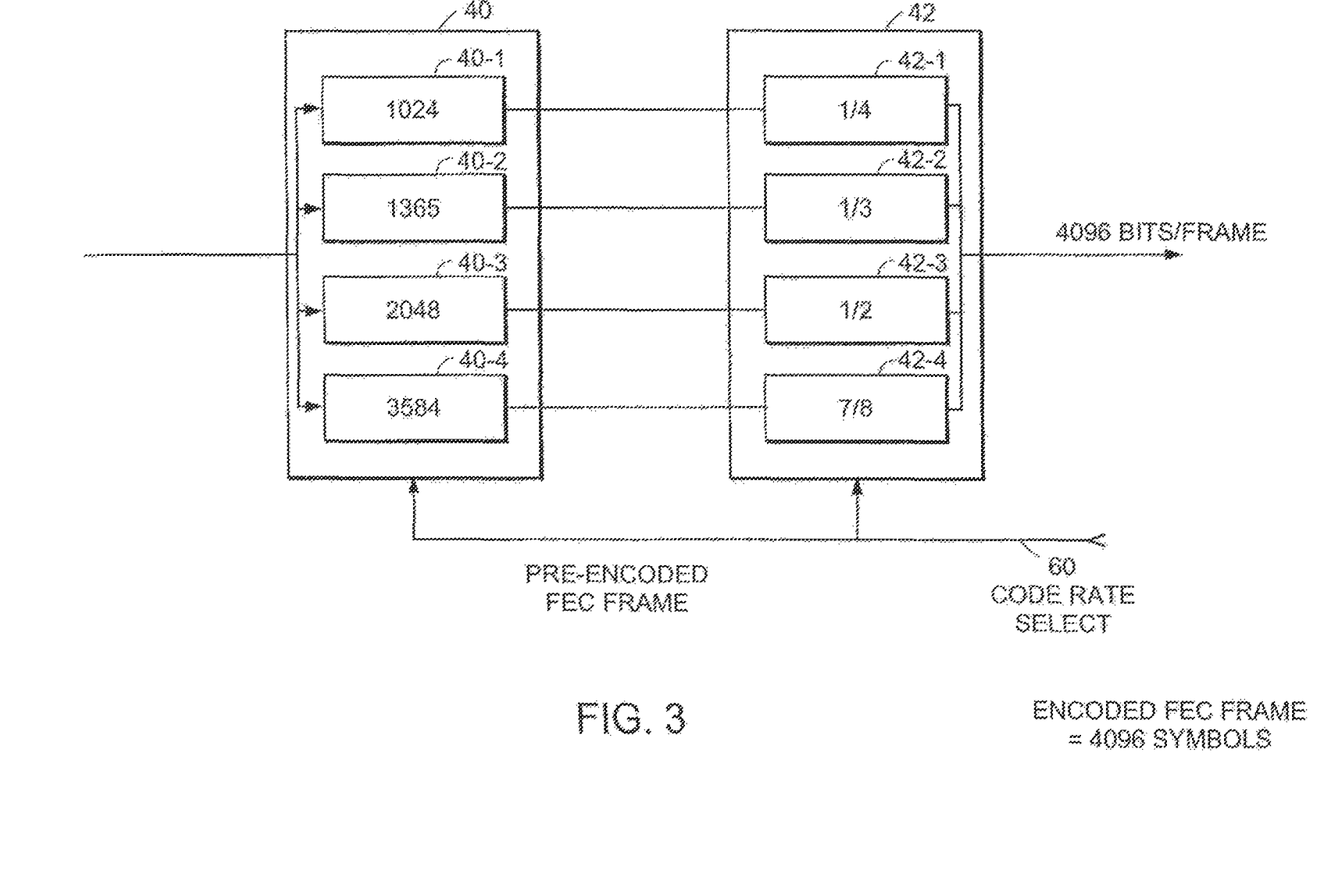
FIG. 3 shows a particular set of framing circuits and corresponding coding circuits.

FIG. 3 is a diagram showing how the framers 40 and FEC encoders 42 are selected in pairs to accomplish this end result. The fixed output FEC frame size in the illustrated embodiment is 4096 symbols. This embodiment uses four different FEC symbol, encoders 42-1, 42-2, 42-3, and 42-4 providing, respectively, a 1/4, 1/3, 1/2, and 7/8 rate encoding. The coding rate of each FEC symbol encoder 42 indicates the ratio of the number of input bits to the number of output bits. The actual codes used by the FEC encoders 42 may be any of a number of different types of error correction codes such as R, thus, a higher information rate is obtained with higher rate FEC code.

This embodiment also uses four framer circuits 40-1, 40-2, 40-3, 40-4 corresponding to the four FEC encoders 42-1, 42-2, 42-3, 42-4. For example, the 1/4 rate encoder 42-1 requires a 1/4 rate framing circuit 40-1 which groups incoming bits into pre-encoded FEC groups of 1024 bits, producing the desired 4096 output symbols. Similarly, the 1/3 rate encoder 42-2 requires a 1/3 rate framer 40-2 to group incoming bits into pre-encoded sets of approximately 1365 bits. The 1/2 rate encoder 42-3 users a framer 40-3 with a pre-encoded set size of 2048, and 7/8 encoder 42-4 uses a framing circuit 40-4 with the pre-encoded size of 3584 bits.

Framing circuit 40 and FEC encoder 42 thus only utilize one of the specific framers 40-1, 40-2, 40-3, or 40-4, and one of the specific encoders 42-1, 42-2, 42-3, or 42-4 at any given point in time. Which particular framing circuit 40 and FEC encoder 42 is activated is controlled by coding rate control signal 60 input to each of the framing circuits 40 and encoder 42. The code rate select signal 60 is generated by the controller 30.

Returning attention now to FIG. 2, a given connection may require multiple traffic channels to be allocated at a particular time. For circuits 46-1 and channel modulators 48-1, which impress not only a quadrature phase shift keyed (QPSK) modulation, but also the appropriate pseudorandom noise (PN) and/or Walsh or other coding in order to produce multiple CDMA channel signals 49-1, 49-n. These multiple CDMA traffic signals are then summed by the summer 50, together with the pilot channel signal produced by the channel pilot circuits 32 and the paging signal produced by the paging channel circuit 34. The output of summer 50 is then fed to the RF up converter 52.

The controller 30, which may be any convenient suitable microcontroller or microprocessor, also has among its software programs a process referred to as the capacity manager 55. The capacity manager 55 not only allocates one or more of the channel modulators 48 to a specific forward link 16 traffic channel connection, but also sets the value for the code rate select signals 60. In addition, the capacity manager 55 sets power levels for particular forward link signals 16.

A single capacity manager 55 in a base station processor 12 may manage 15 multiple traffic channel circuits 36, each producing a number of forward link signals 16. The capacity manager 55 sets the code rate select signal 60 according to observed conditions in a corresponding traffic channel. These adjustments to the channel physical layer characteristics are made preferably in response to determining a signal strength value, such as by measuring a ratio of the energy per data bit divided by a normalized noise power level (Eb/No) at the receiver.

Thus, in addition to changing the power level of the individual modulated signals generated by the modulators 48, it is also possible with a system according to the invention to control the Eb/No at the receiver by adjusting the value of code rate select signal 60 in order to select different code rates under different conditions.

For example, if a remote access unit 14 located deep inside of building is experiencing particularly adverse multipath or other distortion conditions, in the past it was thought necessary to increase the power level of the forward link 16-n in order to obtain an appropriate received signal level at the access unit 14. However, with the invention, if a full maximum data rate is not needed, then the coding rate implemented by the FEC encoder 42 can be lowered.

And in other environments where multipath distortion is minimal, such as in a direct line of sight situation, the highest code rate generator 42-4 can be selected while at the same time reducing the radiated power level on forward link 16-n for that particular channel. This therefore maximizes the available data rate for a given user while also minimizing interference generated to other users of the same radio channel.

Thus, in environments where propagation is good, the system 10 can increase the data rate to a given user without introducing additional interference to other users. However, in a bad signaling environment, an advantage is also obtained since each particular user channel can be made more robust without increasing its power level.

Continuing to pay attention to FIG. 2, various components of the access unit 14 will be discussed in more detail. The access unit 14 consists of an RF down converter 80, equalizer 62, multiple rake receivers 64-1, ..., 64-n, multiple channel demodulators 66-1, ..., 66-n, a multiplexer 68, an FEC decoder 70, and framing circuit 72.

The RF down converter 60 accepts the forward link signal 16-n, producing a baseband digitized signal. The chip equalizer 62 provides equalization of individual chips of the received signal, fitting it to one of several rake finger and interference cancellation circuits 64. These circuits cooperate with multiple channel demodulator 66 in a manner which is known in the prior art and a strip off the CDMA encoding on each channel. Pilot receiving circuit 74 and paging signal receiving circuit 76 similarly are adapted for receiving the pilot channel signal and the paging signal generated by the base station processor 12. The multiplexer 68 reconstructs signals in the situation where multiple traffic channels were allocated to the particular connection.

A controller 80 executes programs which set various parameters of the components of the traffic channel circuit 58. Of particular interest here is the fact that the controller 80 executes a management process 82 which determines the coding rate select signal 84 to be sent to the FEC decoder 70.

Specifically, the coding rate selected by the FEC decoder 70 at the receiving access unit 14 must be the same as the coding rate of the FEC encoder 32 at the transmitting base station processor 12 in order for, the receiver framing circuit 72 to correctly reproduce the input data signal. Thus, in order for the system 10 to adapt to changing conditions in the RF link 16, it is necessary for the base station processor 12 to communicate this information to the access unit 14 in some manner.

For example, if it is desired to allow the coding rate to change during the duration of a connection, which is the case in the preferred embodiment, the paging channel 34 may initially include, during a channel acquisition sequencing, a command to inform the access unit 14 not only of the different channels 36 on which it will be communicating, but also to inform it of the particular encoding rate that it will be using. Then, as a connection remains open and coding rates that are optimum change over time, additional control messages may be embedded in the traffic channel itself by embedding a command message within the received data which is fed back to the controller 80 via a command signal input 86.

It should be understood that measures of link quality can also be determined by the controller 80 from the output signal 88 and periodically sent back to the controller 30 in the base station processor 12 via a command structure on a reverse link channel (not shown). This permits the controller 30 at the base station processor 12 to appropriately set optimum FEC coding rates to be used by the FEC encoder 42 and the FEC decoder 70 for particular connections.

Figure 4:
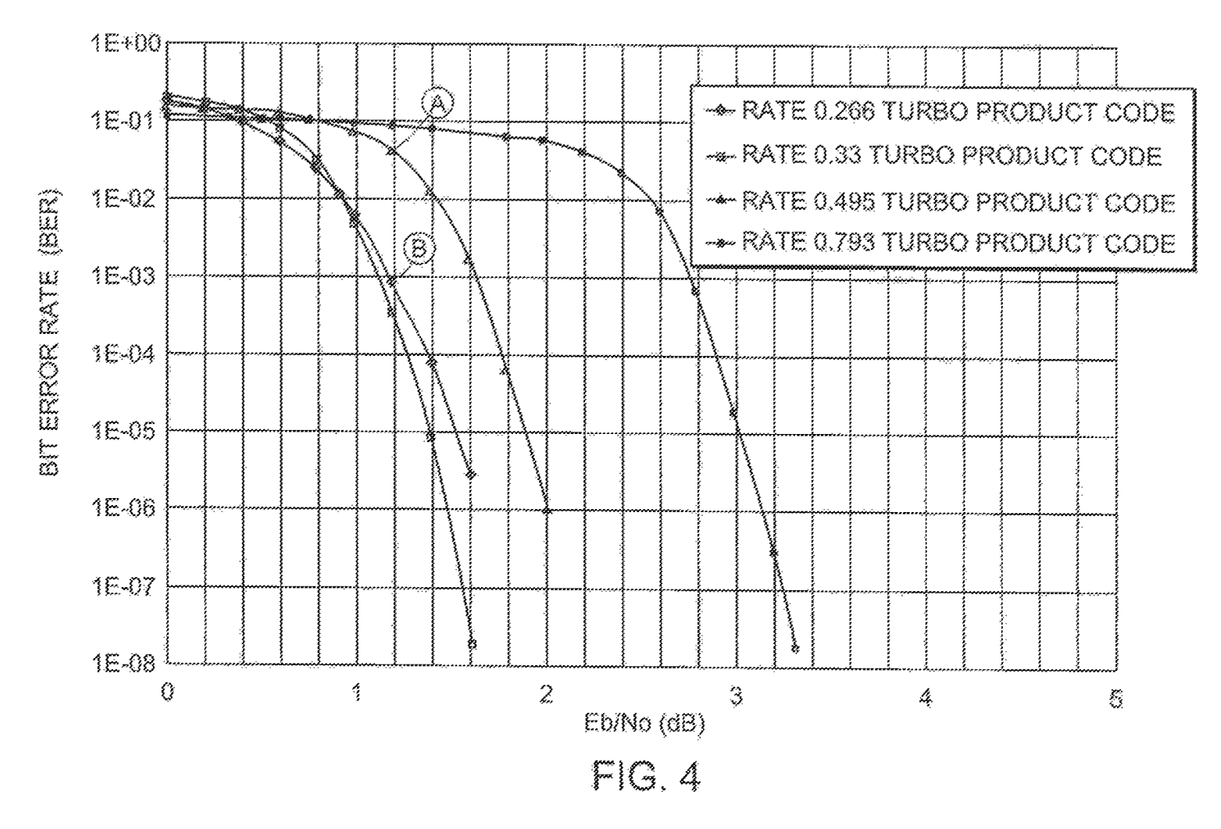
FIG. 4 is a chart of bit error rate versus received signal strength as measured in energy per bit versus spectral noise power for different coding rates.

FIG. 4 is a chart of bit error rate (BER) versus Eb/No in decibels (dB) for various combinations of framers 40 and FEC encoders 42. The legend in the graph shows the performance of different rate turbo product codes normalized for the energy in a particular bit. For example, in a state indicated at point A, the particular channel may be operating with approximately 1/2 rate turbo product code and experiencing relatively low bit error rate of 0.05. Without adjusting the transmit power and by merely selecting a lower rate turbo product code such as the approximately 1/4 rate code (indicated by the rate 0.288 turbo product code) a state B is entered for the system in which the bit error rate is markedly decreased to approximately 0.0002. This is accomplished without adjusting the energy per bit or otherwise altering transmit power level.

While this invention has been particularly shown and described with references to preferred embodiments thereof, it will be understood by those skilled in the art that various changes in form and details may be made therein without departing from the scope of the invention encompassed by the appended claims.

Although features and elements are described above in particular combinations, each feature or element can be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such, as internal hard, disks and removable disks, magneto-optical, media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

A processor in association with software may be used to implement a radio frequency transceiver for use in a wireless transmit receive unit (WTRU), user equipment (UE), terminal, base station, radio network controller (RNC), or any host computer. The WTRU may be used in conjunction with modules, implemented in hardware and/or software, such as a camera, a video camera module, a videophone, a speakerphone, a vibration device, a speaker, a microphone, a television, transceiver, a hands free headset, a keyboard, a Bluetooth® module, a frequency modulated (FM) radio unit, a liquid crystal, display (LCD) display unit, an organic light-emitting diode (OLED) display unit, a digital music player, a media player, a video game player module, and Internet browser and/or any wireless local area network (WLAN) or Ultra Wide Band (UWB) module.

What is claimed is:

1. A subscriber unit comprising:
a forward error correction (FEC) encoder configured to encode a plurality of frames, each of the plurality of frames including a variable number of data bits, to include an error correction code such that a resulting number of output symbols remains fixed;
a modulator configured to modulate the output symbols;
wherein the error correction code is selected based on a channel condition associated with the subscriber unit;
wherein the FEC encoder is configured to produce a fixed number of output FEC symbols in each given transmitted frame;
wherein the plurality of frames vary in pre-encoded bit size depending upon the error correction code selected at any given time by the FEC encoder and wherein the fixed number of output FEC symbols is produced by the FEC encoder for any error correction code selected, FEC coding rate, power level, symbol modulation type, or any combination thereof; and
wherein different FEC coding rates, symbol rates, and FEC codes are assignable to each of a plurality of user channels depending on channel conditions without changing an effective transmitted power level.

2. The subscriber unit of claim 1, wherein the modulator modulates the output symbols according to a multiple-access modulation technique to produce a modulated encoded signal.

3. The subscriber unit of claim 2, further comprising:
a radio frequency up-converter configured to transmit the modulated encoded signal.

4. The subscriber unit of claim 1, wherein one of the plurality of frames is selected to produce, when encoded, a desired number of output symbols in an encoded frame.

5. A subscriber unit comprising:
a framer configured to receive data bits and generate frames having a predetermined length; and
a forward error correction (FEC) encoder configured to encode the frames to include an error correction code, wherein a length of the encoded frame remains fixed as a number of data bits varies;
wherein the FEC encoder is configured to produce a fixed number of output FEC symbols in each given transmitted frame;
wherein the plurality of frames vary in pre-determined bit size depending upon the error correction code selected at any given time by the FEC encoder and wherein the fixed number of output FEC symbols is produced by the FEC encoder for any error correction code selected, FEC coding rate, power level, symbol modulation type, or any combination thereof; and
wherein different FEC coding rates, symbol rates, and FEC codes are assignable to each of a plurality of user channels depending on channel conditions without changing an effective transmitted power level.

6. The subscriber unit of claim 5, further comprising:
a modulator configured to modulate the encoded frames according to a multiple-access modulation technique to produce a modulated encoded signal.

7. The subscriber unit of claim 6, further comprising:
a radio frequency up-converter configured to transmit the modulated encoded signal.

8. The subscriber unit of claim 5, further comprising:
a processor configured to generate a coding rate signal; and
the FEC encoder encodes the frames to include the error correction code, wherein the length of the encoded frame remains fixed as the number of data bits varies based on the coding rate signal.

9. A method for encoding data, the method comprising:
receiving a plurality of frames, each of the plurality of frames including a unique number of bits of data;
forward error correction (FEC) encoding, by an FEC encoder, each of the plurality of frames to include a plurality of error correction codes, one error correction code for each of the plurality of frames, to produce a plurality of encoded frames such that a resulting number of encoded symbols of each of the plurality of encoded frames is the same;
wherein the one error correction code is selected based on a channel condition associated with a subscriber unit;
producing, via the FEC encoder, a fixed number of output FEC symbols in each given transmitted frame such that the resulting number of encoded symbols of each of the plurality of encoded frames is the same;
wherein the plurality of frames vary in pre-encoded bit size depending upon the error correction code selected at any given time by the FEC encoder for each of the plurality of frames and wherein the fixed number of output FEC symbols is produced by the FEC encoder for any error correction code selected, FEC coding rate, power level, symbol modulation type, or any combination thereof; and
wherein different FEC coding rates, symbol rates, and FEC codes are assignable to each of a plurality of user channels depending on channel conditions without changing an effective transmitted power level.

10. The method of claim 9, further comprising:
selecting a code rate of the plurality of error correction codes such that a resulting number of encoded symbols of each of the plurality of encoded frames is the same.

11. The method of claim 9, further comprising:
modulating the plurality of encoded frames to produce a modulated encoded signal.

12. The method of claim 9, further comprising:
modulating the plurality of encoded frames to produce a modulated encoded signal; and
transmitting the modulated encoded frames via the modulated encoded signal.

13. The subscriber unit of claim 1, further comprising:
a framer to encode the plurality of frames; and
wherein the framer and FEC encoder are selected in pairs to frame and encode the plurality of frames and to produce the fixed number of output FEC symbols in each given transmitted frame.

14. The subscriber unit of claim 5, further comprising:
a framer to encode the plurality of frames; and
wherein the framer and FEC encoder are selected in pairs to frame and encode the plurality of frames and to produce the fixed number of output FEC symbols in each given transmitted frame.

15. The method of claim 9, further comprising:
selecting a framer and the FEC encoder in pairs to frame and encode the plurality of frames and to produce the fixed number of output FEC symbols in each given transmitted frame.

* * * * *